United States Patent
Krysak et al.

(10) Patent No.: US 10,692,757 B2
(45) Date of Patent: Jun. 23, 2020

(54) MEANS TO DECOUPLE THE DIFFUSION AND SOLUBILITY SWITCH MECHANISMS OF PHOTORESISTS

(71) Applicant: Intel Corporation, Santa Clara, CA (US)

(72) Inventors: Marie Krysak, Portland, OR (US); Robert Lindsey Bristol, Portland, OR (US); Paul Anton Nyhus, Portland, OR (US); Michael J. Leeson, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 32 days.

(21) Appl. No.: 15/568,791

(22) PCT Filed: May 28, 2015

(86) PCT No.: PCT/US2015/033060
§ 371 (c)(1),
(2) Date: Oct. 23, 2017

(87) PCT Pub. No.: WO2016/190887
PCT Pub. Date: Dec. 1, 2016

(65) Prior Publication Data
US 2018/0102282 A1 Apr. 12, 2018

(51) Int. Cl.
*G03F 7/004* (2006.01)
*H01L 21/768* (2006.01)
(Continued)

(52) U.S. Cl.
CPC ...... *H01L 21/76816* (2013.01); *C08F 212/14* (2013.01); *C08F 212/32* (2013.01);
(Continued)

(58) Field of Classification Search
CPC ...... G03F 7/004; G03F 7/0045; G03F 7/0382; G03F 7/0392; G03F 7/095; G03F 7/2002;
(Continued)

(56) References Cited

U.S. PATENT DOCUMENTS 7,452,658 B2    11/2008  De Silva et al.
9,152,043 B2 *  10/2015  Lawson ............... G03F 7/038
(Continued)

FOREIGN PATENT DOCUMENTS

TW      201234104       8/2012
WO      WO-2015037735   3/2015

OTHER PUBLICATIONS

International Search Report and Written Opinion for PCT Patent Application No. PCT/US2015/033060 dated Oct. 29, 2015, 13 pgs.
(Continued)

*Primary Examiner* — Amanda C. Walke
(74) *Attorney, Agent, or Firm* — Schwabe, Williamson & Wyatt, P.C.

(57) ABSTRACT

Embodiments of the invention include photoresist materials and methods of patterning photoresist materials. In an embodiment a photoresist material comprises a plurality of molecular glasses (MGs). In an embodiment, a glass transition temperature Tg of the photoresist material is less than an activation temperature needed to deblock blocking groups from the MGs. Embodiments include a method of patterning a photoresist material that comprises exposing the photoresist material with ultraviolet radiation. The method may also comprise, performing a first post exposure bake at a first temperature, that is less than the activation temperature needed to deblock blocking groups from the MGs, and performing a second post exposure bake at a second tem-
(Continued)

perature that is approximately equal to or greater than the activation temperature needed to deblock blocking groups from the MGs.

11 Claims, 8 Drawing Sheets

(51) Int. Cl.

| | |
|---|---|
| H01L 21/311 | (2006.01) |
| H01L 21/027 | (2006.01) |
| G03F 7/20 | (2006.01) |
| G03F 7/038 | (2006.01) |
| G03F 7/039 | (2006.01) |
| G03F 7/095 | (2006.01) |
| C08F 212/32 | (2006.01) |
| C08F 212/14 | (2006.01) |
| G03F 7/32 | (2006.01) |
| G03F 7/38 | (2006.01) |
| H01L 23/498 | (2006.01) |

(52) U.S. Cl.
CPC .......... *G03F 7/0045* (2013.01); *G03F 7/0382* (2013.01); *G03F 7/0392* (2013.01); *G03F 7/095* (2013.01); *G03F 7/2002* (2013.01); *G03F 7/2004* (2013.01); *G03F 7/2022* (2013.01); *G03F 7/32* (2013.01); *G03F 7/38* (2013.01); *H01L 21/0271* (2013.01); *H01L 21/0274* (2013.01); *H01L 21/31144* (2013.01); *H01L 21/76808* (2013.01); *H01L 21/76897* (2013.01); *H01L 23/49827* (2013.01)

(58) Field of Classification Search
CPC ........ G03F 7/2004; G03F 7/2022; G03F 7/32; H01L 21/0271; H01L 21/0274; H01L 21/31144; H01L 21/76808; H01L 21/76897; C08F 212/14; C08F 212/32; C08F 212/145
USPC ...................................... 430/270.1
See application file for complete search history.

(56) References Cited

U.S. PATENT DOCUMENTS

| 9,400,429 | B2* | 7/2016 | Toyokawa | ................ G03F 7/26 |
|---|---|---|---|---|
| 9,417,523 | B2* | 8/2016 | Takahashi | ............... G03F 7/038 |
| 2007/0128541 | A1* | 6/2007 | Kojima | ................. G03F 7/0382 |
| | | | | 430/270.1 |
| 2011/0097668 | A1 | 4/2011 | Lawson et al. | |
| 2012/0208127 | A1* | 8/2012 | Hatakeyama | ........... G03F 7/038 |
| | | | | 430/283.1 |
| 2013/0017376 | A1* | 1/2013 | Okuyama | ............. G03F 7/0382 |
| | | | | 428/195.1 |
| 2015/0140491 | A1 | 5/2015 | Robinson et al. | |
| 2015/0376157 | A1* | 12/2015 | Echigo | ................. C07C 69/734 |
| | | | | 430/270.1 |
| 2016/0124303 | A1* | 5/2016 | Takasuka | .............. G03F 7/0382 |
| | | | | 430/281.1 |
| 2016/0280675 | A1* | 9/2016 | Yamaguchi | ............. G03F 7/004 |
| 2016/0282720 | A1* | 9/2016 | Takahashi | ............. G03F 7/0382 |
| 2017/0003591 | A1* | 1/2017 | Mochizuki | ........... G03F 7/0045 |
| 2017/0131634 | A1* | 5/2017 | Nakagawa | ........... C07C 381/12 |
| 2017/0351176 | A1* | 12/2017 | Yamaguchi | ...... C08F 12/20 |
| 2018/0074406 | A1* | 3/2018 | Toida | ..................... G03F 7/004 |

OTHER PUBLICATIONS

Anuja De Silva, et al., "Hydorxphenylbenzene derivatives as glass forming molecules for high resolution photoresists", The Royal Society of Chemistry 2008, vol. 18, pp. 1903-1910.
Search Report from European Patent Application No. 15893522.1 dated Dec. 7, 2018, 15 pages.
Junyan Dai et al: "Molecular Glass Resists for High-Resolution Patterning", Chemistry of Materials, 1-5 vol. 18, No. 15, Jul. 1, 2006, 8 pages, XP055525577, ISSN: 0897-4756.
International Preliminary Report on Patentablity for International Patent Application No. PCT/US2015/033060, dated Dec. 7, 2017, 10 pages.
Office Action from Taiwan Patent Application No. 105112448, dated Dec. 3, 2020, 4 pages.
Office Action from Taiwan Patent Application No. 105112448, dated Mar. 16, 2020, 2 pgs.

* cited by examiner

MEANS TO DECOUPLE THE DIFFUSION AND SOLUBILITY SWITCH MECHANISMS OF PHOTORESISTS

CROSS-REFERENCE TO RELATED APPLICATION

This patent application is a U.S. National Phase Application under 35 U.S.C. § 371 of International Application No. PCT/US2015/033060, filed May 28, 2015, entitled "A MEANS TO DECOUPLE THE DIFFUSION AND SOLUBILITY SWITCH MECHANISMS OF PHOTORESISTS," which designates the United States of America, the entire disclosure of which is hereby incorporated by reference in its entirety and for all purposes.

FIELD OF THE INVENTION

Embodiments of the present invention relate generally to the manufacture of semiconductor devices. In particular, embodiments of the present invention relate to interconnect structures for semiconductor devices and methods for manufacturing such devices.

BACKGROUND OF THE INVENTION

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch.

When patterning extremely small vias with extremely small pitches by such lithographic processes, several challenges present themselves, especially when the pitches are around 70 nanometers (nm) or less and/or when the critical dimensions of the via openings are around 35 nm or less. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners.

Thus, improvements are needed in the area of via manufacturing technologies.

DETAILED DESCRIPTION OF THE INVENTION

Figure 1A:
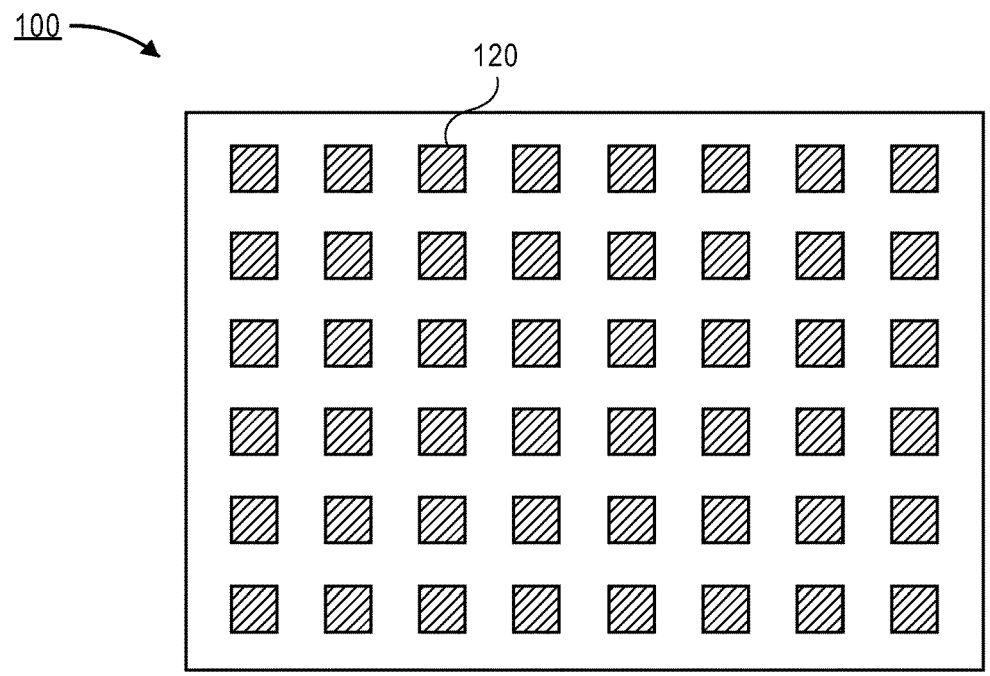
FIG. 1A illustrates a schematic plan view of an interconnect layer that includes a plurality of pre-patterned features, in accordance with an embodiment of the invention.

Described herein are systems that include a substrate with multiple layers with varying compositions and methods of depositing and patterning such layers. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As described above, continued scaling of devices has necessitated that the critical dimension and the pitch of via openings formed in an interconnect layer decrease beyond the traditional capabilities of standard BEOL processing equipment. To overcome the limitations of the existing processing equipment, embodiments of the invention may utilize an interconnect layer 100 that comprises a plurality of pre-patterned features 120. Such an interconnect layer 100 is illustrated in the plan view shown in FIG. 1A. In the illustrated embodiment, the pre-patterned features 120 may be formed at regular intervals over the interconnect layer 100. In the illustrated embodiment, the pre-patterned features 120 are substantially square, though embodiments are not limited to such configurations.

According to an embodiment, pre-patterned features 120 may be formed at every potential location where a via could possibly be formed. A photoresist material may then be deposited into each of the pre-patterned features 120 and the desired locations for the vias may be selectively patterned. Since the photoresist is confined in each pre-patterned feature 120, BEOL lithography equipment does not need to have the capability to resolve the critical dimension of the via. Additionally, the photoresist material does not need to be optimized to produce the desired LWR or CDU characteristics since the pre-patterned features define the pattern of the vias. As such, high dosages that are typically needed for roughness control when developing a photoresist material may be reduced. Therefore, the pre-patterned feature approach may be used to circumvent imaging/dose tradeoff which limits the throughput of next generation lithographic processes.

Figure 1B:
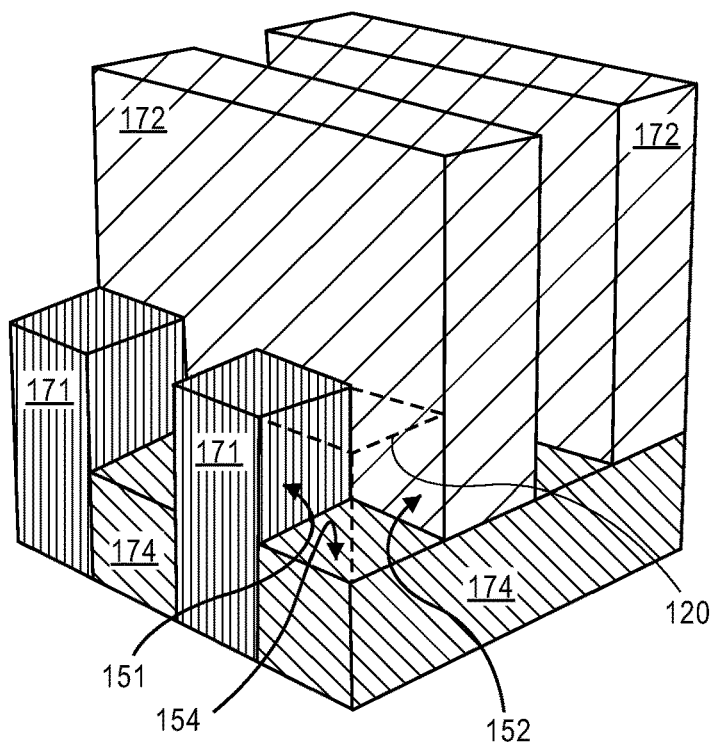
FIG. 1B illustrates a perspective view of an interconnect layer that includes a plurality of pre-patterned features, in accordance with an embodiment of the invention.

The plan view of the interconnect layer 100 in FIG. 1A is depicted as being formed with a single material in order to not unnecessarily obscure the figure. However, according to additional embodiments, the interconnect layer 100 may be formed from multiple materials. An exemplary illustration of how multiple materials may be used to form the pre-patterned features 120 in an interconnect layer 100 is shown in the perspective view of a portion of an interconnect layer 100 illustrated in FIG. 1B. For example, three different materials are illustrated in FIG. 1B. According to an embodiment of the invention, one or more of the materials may be patterned to form a cross-grating. For example, a grating pattern in a first layer 171 may be oriented perpendicular to a grating pattern in a second layer 172 in order to form the cross-grating pattern. A floor layer 174 may be formed in spaces between the cross-grating pattern formed by the first layer 171 and the second layer 172. Together, the layers may define the pre-patterned feature 120. For example, a first wall 151 of the pre-patterned feature may be defined by a portion of the first layer 171, a second wall 152 of the pre-patterned feature may be defined by a portion of the second layer 172, and a floor 154 of the pre-patterned feature may be defined by a portion of the floor layer 174.

Embodiments of the invention may form tightly pitched features that exceed the limits of the BEOL lithography equipment by using a spacer-etching process to form the grating pattern in each layer. Representatively, first sacrificial structures may be formed over a first unpatterned layer 171. The first sacrificial structures may have a pitch and a critical dimension that may be produced by the BEOL lithography equipment. First spacers may then be formed along the sidewalls of the first sacrificial structures. The first sacrificial structures may then be etched away, leaving behind the first spacers. Since two spacers are formed for each sacrificial structure, the spacers may have a pitch that is half the pitch of the sacrificial structures. According to an embodiment, the pitch may optionally be halved again by forming an additional set of spacers along the sidewalls of the first spacers. The pattern of the first spacers may then be transferred into the first unpatterned layer with an etching process, using the first spacers as a mask layer to form the first grating pattern. Next, the second layer 172 may then be deposited over the first grating structure. Thereafter, the spacer-etching process may be repeated with second sacrificial structures and second spacers that are oriented orthogonally to the first grating pattern in order to produce the cross grating pattern illustrated in FIG. 1B.

In an embodiment, each of the layers used to form the interconnect layer 100 may be different materials. For example, the first layer 171 and the second layer 172 may be comprised of one or more materials used in semiconductor fabrication processes, such as, for example, Si, α-Si, oxides (e.g., SiO, TiO, AlO, etc.), nitrides (e.g., SiN, TiN, SiON, TaN, etc.), carbides (e.g., SiC, SiOC, carbon hardmask, etc.). For example, these materials may be formed with various processes, such as spin-on coating, CVD, PVD, ALD, or the like. Various wet cleans may also accompany the etching processes. In general, a final wet clean may be done on the substrate prior to the deposition of the photoresist into the pre-patterned features 120. In an embodiment, the floor layer 174 may be a conductive material, such as a metal contact or an interconnect line of a lower interconnect layer. By way of example, the interconnect line may be copper, tungsten, or any other conductive material used in interconnect lines. Alternatively, the floor layer 174 may be a dielectric material according to an embodiment.

In embodiments, the interconnect layer 100 may be formed directly over a semiconducting substrate (not shown). In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of the present invention. Embodiments may include a semiconducting substrate that includes integrated circuitry. Vias and contacts that are formed on and/or through the interconnect layer 100 may provide electrical contacts to the integrated circuitry. According to an additional embodiment, one or more additional interconnect layers may separate the interconnect layer 100 from a semiconducting substrate. In such embodiments, conductive lines and vias formed on or through the interconnect layer 100 may provide electrical connections to contact lines and vias formed in the additional interconnect layers formed below the interconnect layer 100.

However, even with the use of pre-patterned features, current photoresist systems may still have some limitation. Current photoresist systems used for via patterning are compatible with deep ultra violet (DUV) radiation or extreme ultra violet (EUV) radiation, and are often chemically amplified resist (CAR) systems. In a CAR system, a photoacid generator (PAG) may be included in the resist system. Additionally, the resin used for the resist generally includes a blocking group that prevents the resin from being soluble in a developer. The PAG allows for a photo-acid to be formed upon exposure to a particular wavelength of radiation. For example, in a positive DUV compatible system, radiation that has a 248 nm wavelength may be used to cause the PAG to form a photo-acid. The light induced solubility switch of conventional photoresists occurs during the post-exposure bake after the acid has been formed. During the post exposure bake, the photo-acid simultaneously diffuses and deprotects a polymer. The photo-acid acts as a catalyst in order to "deblock" the blocking group and renders the resin soluble in a developer. Since the photo-acid diffuses while performing the deblocking operation, typically, only the areas of the resin that were exposed to the radiation become soluble in a developer. Accordingly, when the mask used during the exposure of the photoresist is misaligned, the photoresist material may not be able to be completely removed from the pre-patterned feature.

Figure 2A:
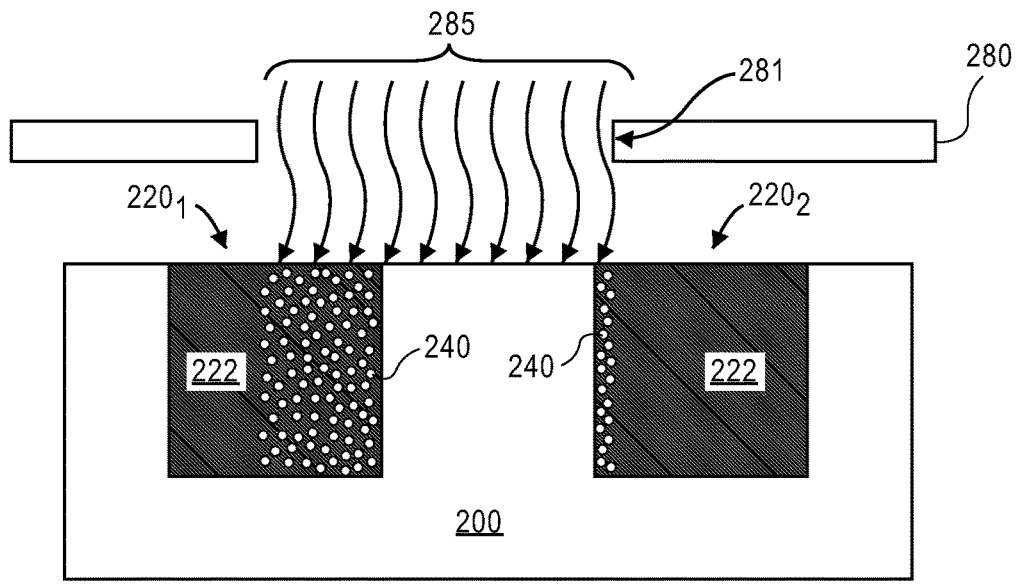
FIG. 2A illustrates a cross-sectional view of pre-patterned features in an interconnect layer that are filled with a photoresist material and exposed to radiation through a mask, in accordance with an embodiment of the invention.
Figure 2B:
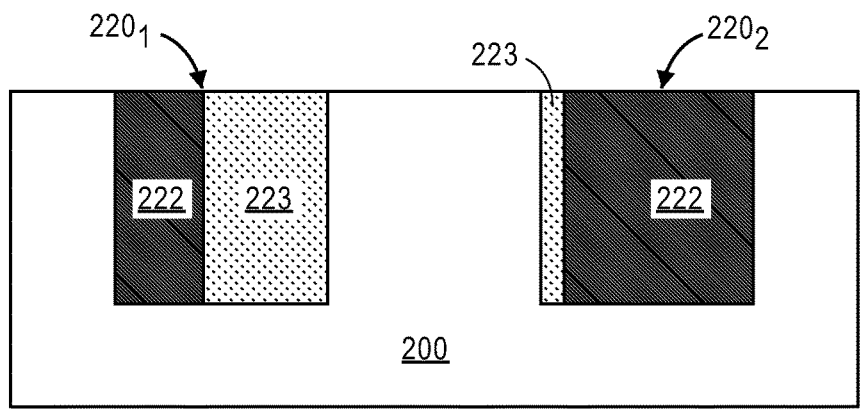
FIG. 2B illustrates a cross-sectional view of the interconnect layer in FIG. 2A after a post exposure bake, in accordance with an embodiment of the invention.
Figure 2C:
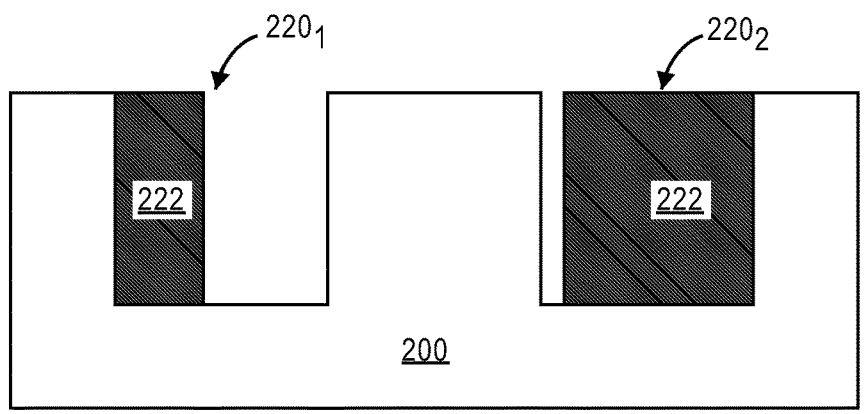
FIG. 2C illustrates a cross-sectional view of the interconnect structure in FIG. 2B after being developed, in accordance with an embodiment of the invention.

FIGS. 2A-2C are cross-sectional illustrations that depict a process for forming vias in conjunction with the pre-patterned features that illustrates the effect misaligning the exposure mask may have on the formation of vias. As shown in FIG. 2A, a photoresist material 222 may be disposed into each of the pre-patterned features 220 formed in an interconnect layer 200. In an embodiment, the photoresist material 222 may be spun on. The photoresist material 222 in one or more of the pre-patterned features 220 may be exposed with radiation 285 from a radiation source (not shown). A mask 280 may be used to shield certain pre-patterned features from the radiation 285 in order to allow for vias to be formed at desired locations. When a positive resist system is used, the opening 281 in the mask is formed where a via is desired, whereas when a negative photoresist system is used, the opening 281 is formed where a via is not desired. However, the openings 281 of the mask may not be aligned properly over the desired pre-patterned feature 220. As illustrated, the opening 281 is offset from the pre-patterned feature $220_1$ that is desired to be patterned, and a portion of the photoresist material 222 is not exposed to the radiation 285. Additionally, a portion of a pre-patterned feature $220_2$ that is not desired to be patterned is partially exposed to the radiation 285. Radiation 285 interacts with PAGs (not shown) in the exposed portions of the photoresist 222 and causes the formation of photo-acids 240. The photo-acids 240 have the ability to alter the solubility of the photoresist material 222 during the post-exposure bake, as described above.

During the elevated temperature of the post-exposure bake, the photo-acids 240 that were generated during the UV exposure simultaneously diffuse and deblock the resin of the photoresist resist material 222 to form deblocked photoresist material 223. Due to the simultaneous diffusion of the photo-acid 240 and deblocking of the resin, the post-exposure bake may allow for only the exposed portions of the pre-patterned feature to be deblocked, as illustrated in FIG. 2B. Accordingly, when the photoresist is developed, as illustrated in FIG. 2C, a portion of the photoresist material 222 may remain in the pre-patterned feature $220_1$. Additionally, a portion of the photoresist material 222 may be removed from the pre-patterned feature $220_2$. The partial removal of photoresist material 222 has several negative consequences. First, in the pre-patterned feature $220_1$ that was desired to be opened, partial removal of the photoresist material 222 results in a via that is not the desired size. As such, the resistance of the via may be higher than desired. Furthermore, the partial opening of the pre-patterned feature $220_2$ that was not desired to be opened, may produce an electrical short circuit in the device that could render the device defective.

In order to allow for substantially complete removal of the photoresist material even when the photoresist material within a pre-patterned feature is not fully exposed, embodiments of the invention included photoresist materials that produce a solubility switch after a two-stage post exposure bake. According to an embodiment, a first stage of the two-stage post exposure bake allows for the photo-generated acid to diffuse through the entire photoresist material within the pre-patterned feature. In the second stage of the two-stage post exposure bake, the photo-acid deprotects the photoresist material to produce the solubility switch. The two-stage post exposure bake, therefore, allows for a complete removal of the photoresist material in the pre-patterned features that are desired to be opened. Additionally, the diffusion of the photo-acid allows for pre-patterned features that are not desired to be patterned to remain unpatterned even when partially exposed. As will be disclosed in greater detail below, the diffusion process allows for the photo-acid to diffuse throughout the entire pre-patterned feature, thereby lowering the concentration of the acid. The lower concentration of acid throughout the photoresist material is not sufficient to deblock enough of the photoresist material and, therefore, prevents a solubility switch in the photoresist material.

According to an embodiment of the invention, the diffusion of the photo-acid may be decoupled from the deblocking reaction by utilizing a photoresist material that has a glass transition temperature $T_g$ that is lower than the temperature needed to activate the deblocking reaction. As such, a first post exposure bake may be implemented at a temperature above the glass transition temperature $T_g$ of the photoresist material, but below the temperature needed to initiate the deblocking reaction. This allows the photo-generated acid to diffuse throughout the photoresist material. After the photo-acid is diffused, the second post exposure bake may be implemented at a temperature sufficient to provide enough activation energy to initiate the deblocking reaction. Accordingly, the photoresist material throughout an entire pre-patterned feature may be developed even when the entire pre-patterned feature is not exposed to radiation. Additionally, decoupling the diffusion of the acid from the deblocking reaction may cure other non-uniformities in patterning, such as those caused by absorption, defocus, or the like. For example, variations in the concentration of the photo-acid in the z-direction of the pre-patterned feature may also be cured by the diffusion in the first post exposure bake.

Furthermore, it is to be appreciated that using a photoresist material with a low glass transition temperature $T_g$ is typically undesirable in photolithography operations that do not utilize pre-patterned features. In such photolithography operations, it is desirable to increase the glass transition temperature $T_g$. For example, the glass transition temperature $T_g$ needs to be at least greater than the temperature needed to activate the deblocking reaction, because the photoresist material is not confined. If the photoresist material were to lose its rigidity (i.e., when the temperature is increased above the glass transition temperature $T_g$), then the photoresist material would not maintain the desired shape. In contrast, the pre-patterned features in embodiments of the present invention confine the photoresist material. The sidewalls of the pre-patterned features prevent the flow of the photoresist material and ensure that the shape of the photoresist material remains substantially unchanged even when the temperature is increased above the glass transition temperature $T_g$ of the photoresist material.

According to an embodiment of the invention, a photoresist material 222 that undergoes a two-stage post exposure bake to produce a solubility switch may comprise low molecular weight molecular glasses (MGs). For example, the MGs may be hydroxylated molecular glasses. In a specific embodiment, the low molecular weight MGs may include MGs that are asymmetrical and ridged. Embodiments of the invention include low molecular weight MGs that have a glass transition temperatures $T_g$ that may be less than approximately 70° C. By way of example, and not by way of limitation, the glass transition temperature of the MGs may be 50° C. or below. In an embodiment, the glass transition temperature $T_g$ may be approximately room temperature.

Figure 3A:
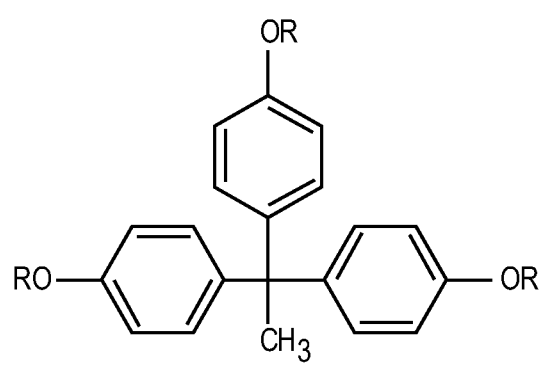
FIG. 3A is a chemical formula of a low molecular weight molecular glass (MG) that may be used in a photoresist material, in accordance with an embodiment of the invention.
Figure 3B:
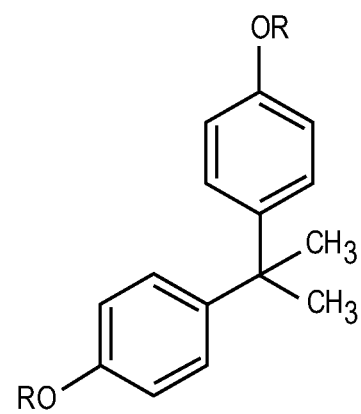
FIG. 3B is a chemical formula of an additional low molecular weight MG that may be used in a photoresist material, in accordance with an embodiment of the invention.

FIGS. 3A and 3B are illustrations of two exemplary MGs that may be used according to embodiments of the invention. In FIG. 3A a triphenol molecule is illustrated, and a bisphenol A (BPA) molecule is illustrated in FIG. 3B. In FIGS. 3A and 3B, the "R" may be hydrogen or a blocking group. By way of example, and not by way of limitation, the blocking group may be any known blocking group, such as, a tert-butyloxycarbonyl (t-BOC) blocking group, an acetal blocking group, an environmentally stable chemically amplified photoresist (ESCAP) blocking group, or the like. The blocking group may be chosen based on the activation energy needed to remove the blocking group. For example, t-BOC blocking groups require a relatively high activation energy (i.e., the temperature during a post exposure bake may need to be maintained at approximately 70° C. or above to provide the require activation energy to initiate the deblocking reaction). Accordingly, selecting a blocking group that requires a high activation energy may allow for a greater difference between the glass transition temperature and the temperature needed to provide the required activation energy for the deblocking reaction. It is to be appreciated that the MGs illustrated in FIGS. 3A and 3B are illustrative in nature and embodiments of the invention are not limited to these specific MGs.

Embodiments of the invention control the solubility contrast and sensitivity of the resist by modulating the ratio of MGs that include blocking groups. For example, if a relatively low ratio of the MGs include blocking groups, then there will not be sufficient solubility contrast between exposed and unexposed photoresist. Alternatively, if the ratio of MGs with blocking groups is relatively large, then the sensitivity of the photoresist material is impacted (i.e., a larger dosage of radiation may be needed to provide sufficient acid to deblock the photoresist material). Additionally, the ratio of MGs with a blocking group alters the glass transition temperature $T_g$ of the photoresist material. For example, when a non-rigid blocking group, such as t-BOC, is used, a higher ratio of MGs with blocking groups will result in a lowering of the glass transition temperature $T_g$. In an embodiment, a ratio of MGs with blocking groups may be greater than approximately 60%. In a specific embodiment, the ratio of MGs with blocking groups may be between approximately 70% and 85%.

Figure 4A:
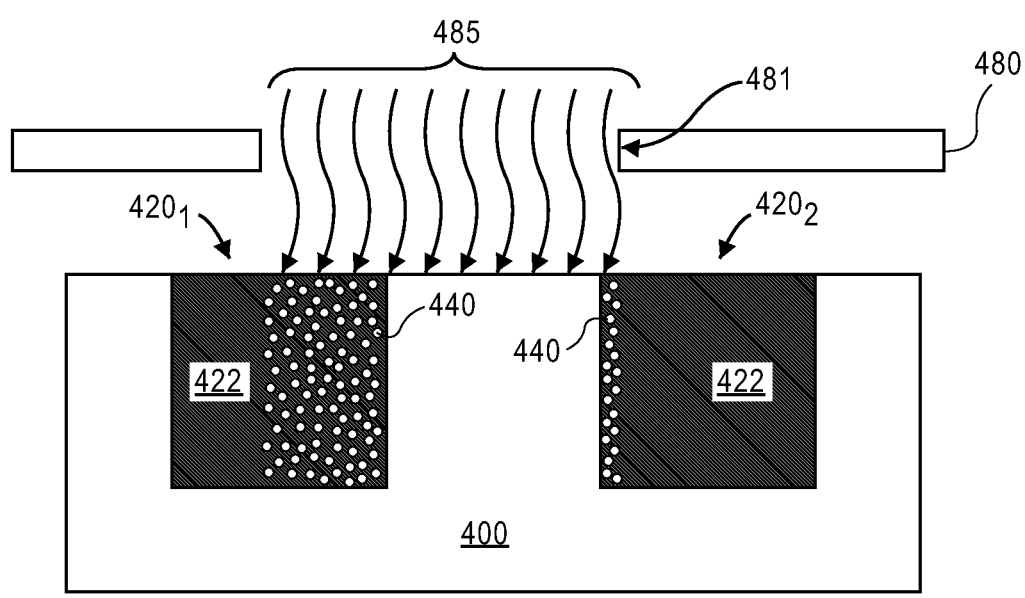
FIG. 4A illustrates a cross-sectional view of pre-patterned features in an interconnect layer that are filled with a photoresist material and exposed to radiation through a mask, in accordance with an embodiment of the invention.

According to an embodiment of the invention, the low glass transition temperature $T_g$ that is present in low molecular weight MGs allows for the solubility switch to occur in a two-stage post exposure bake. Such a process is illustrated in FIGS. 4A-4D. Referring now to FIG. 4A, an interconnect layer 400 with a plurality of pre-patterned features 420 is shown. According to an embodiment, the pre-patterned features 420 are filled with a photoresist material 422 that comprises low-molecular weight MGs, such as those described above. According to an embodiment, the low-molecular weight MGs may comprise a blocking group, such as, for example, t-BOC blocking groups, acetal blocking groups, ESCAP blocking groups, or the like. In an embodiment, the ratio of MGs with blocking groups may be greater than approximately 60%. By way of example, the ratio of MGs with blocking groups may be between approximately 70% and 85%. Accordingly, embodiments of the invention include a photoresist material 422 that includes a glass transition temperature $T_g$ that is less than the temperature required to provide the activation energy needed to deblock the MGs. In an embodiment, the glass transition temperature may be less than approximately 70° C. and the temperature required to provide the activation energy for the deblocking reaction may be greater than approximately 70° C. In an additional embodiment, the glass transition temperature $T_g$ of the photoresist material 422 may be approximately 50° C. or less and the temperature required to provide the activation energy for the deblocking reaction may be greater than approximately 60° C. According to an embodiment, the photoresist material 422 may be disposed into the pre-patterned features 420 with a spin-coating process.

As illustrated in FIG. 4A, the interconnect layer 400 may be exposed to radiation 485 through an opening 481 in the mask 480. By way of example, the radiation 485 may be DUV or EUV radiation. In the illustrated embodiment, the mask opening 481 is offset from the pre-patterned feature $420_1$ that is desired to be patterned. Additionally, the mask opening 481 may be formed partially over a pre-patterned feature $420_2$ that is not desired to be patterned. As illustrated, photo-acids 440 are only generated in the exposed portions of the photoresist material 422. It is to be appreciated that the photo-acids 440 are illustrative in nature, and do not necessarily represent a desired concentration, shape, and/or relative size of the photo-acid in the exposed portions of the photoresist material 422.

Figure 4B:
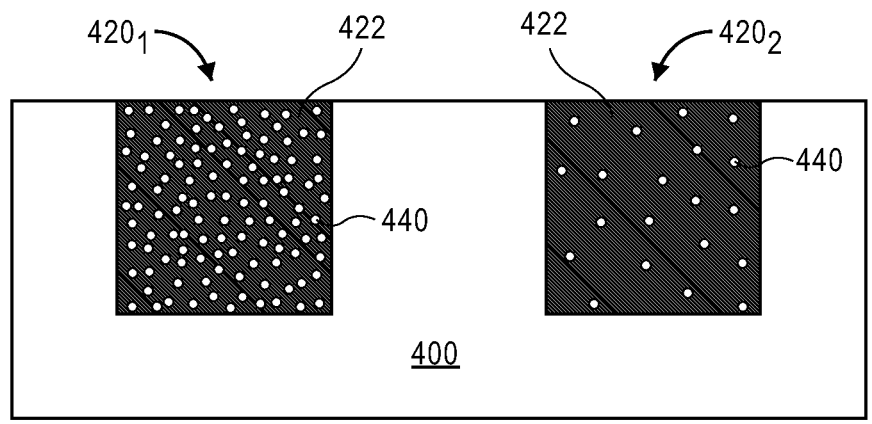
FIG. 4B illustrates a cross-sectional view of the interconnect layer in FIG. 4A after a first post exposure bake, in accordance with an embodiment of the invention.

Referring now to FIG. 4B, a first post exposure bake has been performed. According to an embodiment of the invention, the first post exposure bake may be implemented at a first temperature. The first temperature is chosen to be a temperature that is lower than the temperature required to provide the activation energy needed to initiate the deblocking reaction. In an embodiment, the first temperature may be less than approximately 70° C. By way of example, the first temperature may be greater than approximately 50° C. Embodiments of the invention include a first post exposure bake that is performed for a length of time sufficient to allow for diffusion of the photo-acids 440 throughout the pre-patterned features 420. In an embodiment, the first post exposure bake may be performed for approximately thirty seconds or more. By way of example, and not by way of limitation, the first post exposure bake may be performed for between approximately one minute and approximately two minutes.

As illustrated in FIG. 4B, the concentration of photo-acids 440 in the pre-patterned feature $420_1$ that is desired to be patterned is significantly higher than the concentration of photo-acids 440 in the pre-patterned feature $420_2$ that is not desired to be patterned. Accordingly, even though the pre-patterned feature $420_2$ includes some concentration photo-acids 440, the concentration is not sufficient to provide a solubility switch in the photoresist material 422 after the deblocking reaction, whereas the pre-patterned feature $420_1$ does include a sufficient concentration of photo-acids 440 to provide a solubility switch in the photoresist material after the deblocking reaction. In contrast, when the diffusion and deblocking reaction were not decoupled, as illustrated in FIGS. 2A-2C, the concentration of photo-acid in the exposed portion of the pre-patterned feature $220_2$ that was not desired to be patterned was great enough to cause a solubility switch in the exposed portion of the pre-patterned feature $220_2$. Accordingly, the diffusion operation in the first post exposure bake allows for the localized concentration of the photo-acids in the exposed area of pre-patterned features $220_2$ to decrease to a concentration that does not cause a solubility switch.

Figure 4C:
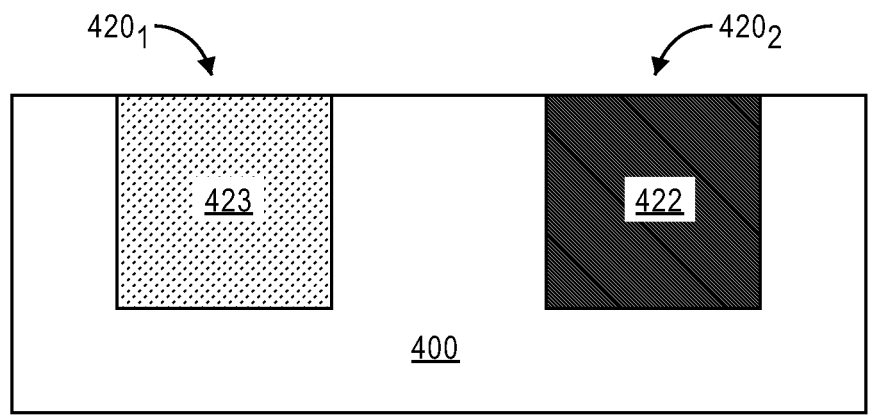
FIG. 4C illustrates a cross-sectional view of the interconnect layer in FIG. 4B after a second post exposure bake, in accordance with an embodiment of the invention.

Referring now to FIG. 4C, a second post exposure bake has been performed. According to an embodiment of the invention, the second post exposure bake is implemented at a second temperature that is higher than the first temperature used in the first post exposure bake. According to an embodiment, the second temperature is at or above the temperature required to provide the activation energy needed to initiate the deblocking reaction. For example, the second temperature may be greater than approximately 60° C. In a specific example where t-BOC blocking groups are used, embodiments may include a second temperature that is greater than approximately 70° C. By way of example, the second temperature may be between approximately 70° C. and approximately 120° C. In an embodiment, the second post exposure bake may be performed for a period of time sufficient to allow for the deblocking reaction to cause a solubility switch in the photoresist material 422, thereby converting the photoresist material 422 into soluble photoresist material 423. By way of example, the second post exposure bake may be implemented for approximately thirty seconds or greater. In a certain embodiment, the second post exposure bake may be implemented for between approximately one minute and approximately three minutes. According to an embodiment, the second post exposure bake may not provide sufficient deblocking of the photoresist material 422 in the pre-patterned feature $420_2$ that is not desired to be developed to cause a solubility switch. For example, there may not be a high enough concentration of photo-acid 440 in the pre-patterned feature $420_2$ to produce a solubility switch in the photoresist material 422 when approximately fifty percent or less of the pre-patterned feature $420_2$ is exposed to the radiation 485.

Figure 4D:
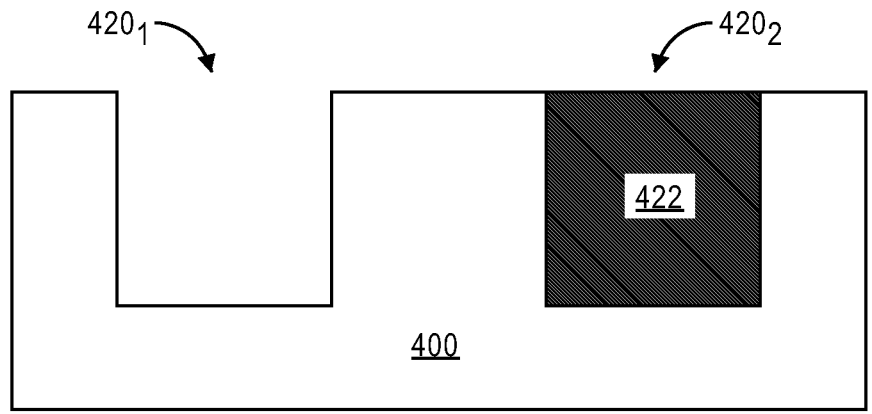
FIG. 4D illustrates a cross-sectional view of the interconnect structure in FIG. 4C after being developed, in accordance with an embodiment of the invention.

Referring now to FIG. 4D, the interconnect layer 400 has been exposed to a developing solution. According to an embodiment, only the soluble photoresist material 423 in the pre-patterned feature $420_1$ is removed by the developing solution, and the pre-patterned feature $420_2$ may include photoresist material 422 that remained substantially insoluble to the developing solution even though it was partially exposed to radiation.

According to additional embodiments of the invention, a two-stage post exposure bake may also be utilized to pattern a negative tone photoresist system. In typical negative tone photoresist systems, a cross-linking molecule is used to initiate a cross-linking reaction that renders the exposed photoresist material insoluble to the developer. For example, UV exposure may activate the cross-linking molecule. During the post-exposure bake, the activated cross-linking molecules may be provided with sufficient activation energy to initiate the cross-linking reaction that renders the photoresist material insoluble. Accordingly, when a single post exposure bake is used to initiate the cross-linking operation, only the exposed areas are able to be cross-linked to produce a solubility switch. As such, embodiments of the present invention allow for a two-stage post exposure bake that allows for the diffusion of the cross-linking molecules before the cross-linking molecules are activated.

Figure 5:
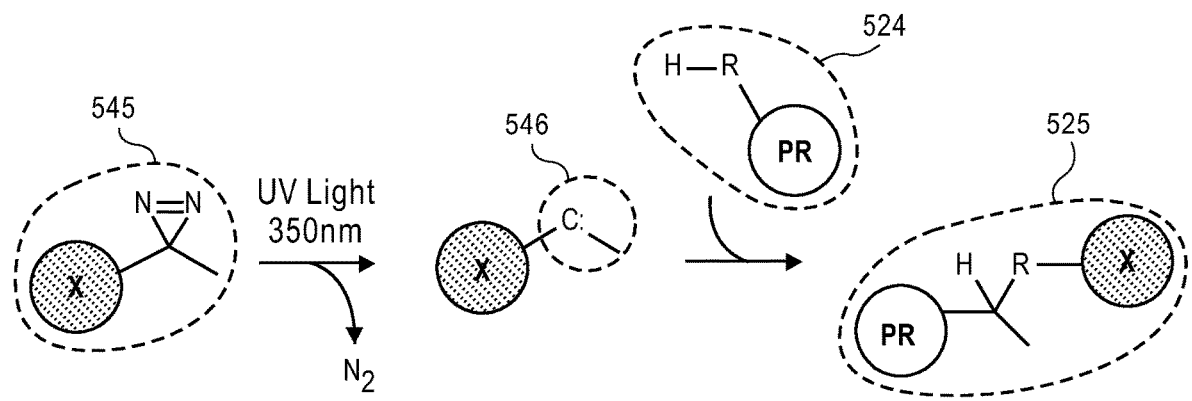
FIG. 5 is a schematic diagram of chemical reactions that may be used in a negative tone photoresist material, in accordance with an embodiment of the invention.

FIG. 5 is a schematic illustration of chemical reactions that may be used in a negative tone photoresist when the diffusion of the cross-linking molecules and the activation of the cross-linking reaction are decoupled, in accordance with embodiments of the invention. In an embodiment, the decoupling of the two processes is made possible by utilizing a cross-linking molecule 545 that is activated with radiation that has a wavelength that is different than the wavelength of the radiation used to generate photo-acids from the PAGs in the photoresist material. For example, the PAGs may require EUV radiation to form photo-acids, whereas the cross-linking molecule 545 may be activated with radiation in the range of 330 nm to 370 nm. In an embodiment, the cross-linking molecule 545 may be a diazirine-based cross-linking molecule. In the diazirine-based cross-linking molecule 545 the "X" may be an organic molecule, such as, for example, a benzene ring. Diazirine-based cross-linking molecules are activated with radiation that has a wavelength of approximately 350 nm. As illustrated, when the diazirine-based cross-linking molecule 545 is exposed to radiation with a wavelength of approximately 350 nm, $N_2$ gas is released and a highly reactive carbene intermediate 546 is formed. Such intermediates 546 can form covalent bonds through addition reactions with amine groups "R" formed on cross-linkable photoresist material 524 during a post exposure baking operation to form insoluble cross-linked photoresist material 525. As will be discussed in greater detail below, the cross-linkable photoresist material 524 may be produced by deblocking a photoresist material 522 with a photo-acid (not shown in FIG. 5). Accordingly, the ability to control the timing of when the cross-linking molecule 545 is activated by the radiation allows for a two-stage post exposure bake.

Figure 6A:
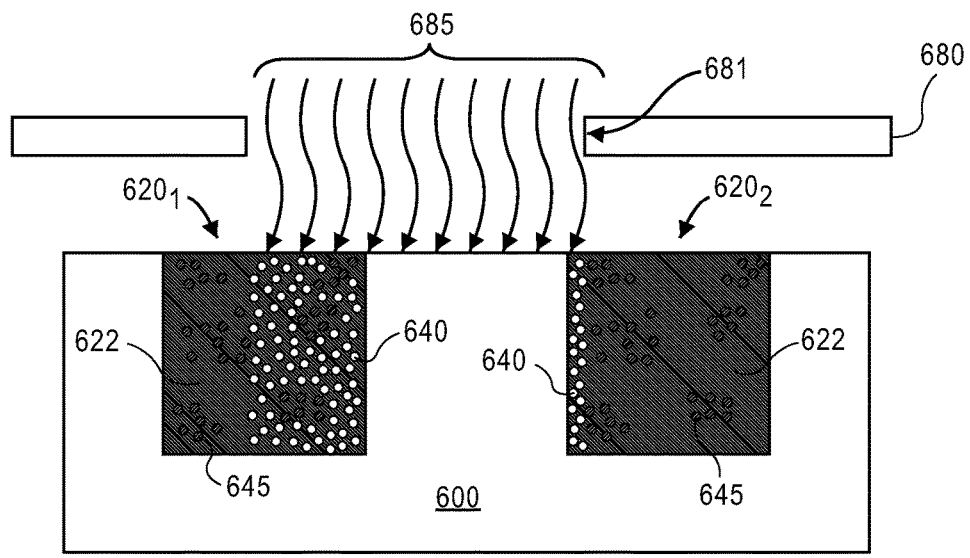
FIG. 6A illustrates a cross-sectional view of pre-patterned features in an interconnect layer that are filled with a photoresist material and exposed to radiation through a mask, in accordance with an embodiment of the invention.

In an embodiment, the solubility switch produced by the cross-linking molecules being activated may be decoupled from the diffusion of photo-acid and diffusion of the cross-linking molecules in a two-stage post exposure bake. Such a process is illustrated in FIGS. 6A-6D. Referring now to FIG. 6A, an interconnect layer 600 with a plurality of pre-patterned features 620 are shown. According to an embodiment, the pre-patterned features 620 are filled with a photoresist material 622 that comprises low-molecular weight MGs, such as those described above, and cross-linking molecules 645. According to an embodiment of the invention, the cross-linking molecule 645 may be a cross-linking molecule that is activated by exposure to radiation that is a different wavelength than the wavelength of the radiation used to generate the photo-acid 640 from PAGs (not shown) within the photoresist material 622. In an embodiment, the cross-linking molecule 645 may be activated by exposure to radiation that has a wavelength between 330 nm and 370 nm. By way of example, and not by way of limitation, the cross-linking molecules 645 may be diazirine-based crosslinking molecules.

In some embodiments, the cross-linking molecules 645 may not be uniformly distributed throughout photoresist material 622. For example, the cross-linking molecules 645 may be locally segregated due to differences in the surface energy between materials in the photoresist material 622. It is to be appreciated that the cross-linking molecules 645 are illustrative in nature, and do not necessarily represent a desired concentration, relative size, and/or shape of the cross-linking molecules 645. According to an embodiment, the low-molecular weight MGs may comprise a blocking group that may be modifiable by an acid to form a group that is susceptible to reacting with the activated cross-linking molecules. By way of example, when the MGs are deblocked by the photo-acid, an amine group may be accessible for cross-linking with the activated cross-linking molecules. According to an embodiment, the photoresist material 622 may be disposed into the pre-patterned features 620 with a spin-coating process.

As illustrated in FIG. 6A, the interconnect layer 600 may be exposed to radiation 685 through an opening 681 in the mask 680. By way of example, the radiation 685 may be EUV radiation. The EUV radiation allows for the production of photo-acids 640 within exposed photoresist material 622, but the EUV radiation does not activate the cross-linking molecule 645. In the illustrated embodiment, the mask opening 681 is offset from the pre-patterned feature $620_1$ that is not desired to be patterned. Additionally, the mask opening 681 may be formed partially over a pre-patterned feature $620_2$ that is desired to be patterned. As illustrated, the photo-acids 640 are only generated in the exposed portions of the photoresist material 622. It is to be appreciated that the photo-acids 640 are illustrative in nature, and do not necessarily represent a desired concentration, shape, and/or relative size of the photo-acid 640 in the exposed portions of the photoresist material 622.

Figure 6B:
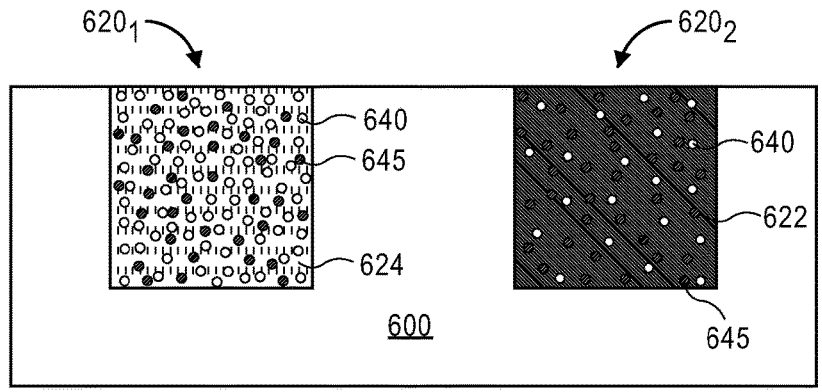
FIG. 6B illustrates a cross-sectional view of the interconnect layer in FIG. 6A after a first post exposure bake, in accordance with an embodiment of the invention.

Referring now to FIG. 6B, a first post exposure bake has been performed. According to an embodiment, the first post exposure bake may be implemented at a first temperature and for a first period of time. The first temperature and the first period of time may be chosen to allow for the photo-acids 640 and the cross-linking molecules 645 to diffuse throughout the photoresist material 622. In an embodiment the first post exposure bake may be performed for approximately thirty seconds or more. By way of example, and not by way of limitation, the first post exposure bake may be performed for between approximately one minute and approximately two minutes. According to an embodiment of the invention, the photo-acids 640 may also deblock the photoresist material 622 during the first post exposure bake. For example, the deblocking of the photoresist material 622 may result in an amine group being made available on a plurality of MGs to allow for cross-linking with the cross-linking molecule 645 in a subsequent operation. As illustrated in FIG. 6B, the concentration of photo-acids 640 in the pre-patterned feature $620_1$ that is not desired to be patterned is significantly higher than the concentration of photo-acids 640 in the pre-patterned feature $620_2$ that is desired to be patterned. In embodiments, the concentration of photo-acids 640 in the pre-patterned feature $620_1$ may be sufficient to deblock enough of the MGs so that the photoresist material is converted into cross-linkable photoresist material 624. Additionally, embodiments of the invention include a pre-patterned feature $620_2$ that is not converted into cross-linkable photoresist material even though the photoresist material 622 includes some concentration of photo-acids 640.

Figure 6C:
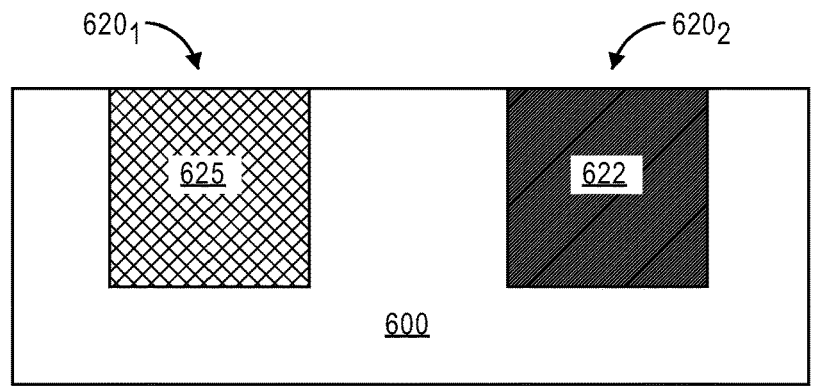
FIG. 6C illustrates a cross-sectional view of the interconnect layer in FIG. 6B after a second post exposure bake, in accordance with an embodiment of the invention.

Referring now to FIG. 6C, a second post exposure bake has been performed. According to an embodiment of the invention, the second post exposure bake includes exposing the interconnect layer 600 to radiation (not shown) that is at a wavelength that will activate the cross-linking molecule 645. According to an embodiment, the exposure during the second post exposure bake may be a blanket exposure. In an embodiment, the radiation may comprise wavelengths between 330 nm and 370 nm. The activation of the cross-linking molecules 645 produces a highly reactive intermediary (not shown). For example, when the cross-linking molecule is a diazirine-based cross-linking molecule, the intermediary may include a carbene. As described above with respect to FIG. 5, the intermediary reacts with cross-linkable photoresist 624 to form insoluble cross-linked photoresist material 625.

According to an embodiment, the second post exposure bake may be implemented at a second temperature that is at or above the temperature required to provide the activation energy needed to initiate the cross-linking reaction. In an embodiment, the second post exposure bake may include a second temperature that is greater than approximately 70° C. By way of example, the second temperature may be between approximately 70° C. and approximately 120° C. In an embodiment, the second post exposure bake may be performed for a period of time sufficient to allow for the cross-linking reaction to cause a solubility switch in the cross-linkable photoresist material 624, thereby converting the cross-linkable photoresist material 624 into insoluble cross-linked photoresist material 625. By way of example, the second post exposure bake may be implemented for approximately thirty seconds or greater. In a specific example, the second post exposure bake may be implemented for between approximately one minute and approximately three minutes. Additionally, it is noted that the second post exposure bake may not provide sufficient cross-linking of the photoresist material 622 in the pre-patterned feature $620_2$ that is desired to be developed. For example, the concentration of the photo-acid 640 may not be great enough to allow for a sufficient percentage of the MGs to be deblocked in order to form an amine group that is susceptible to cross-link formation. While the photoresist material in the pre-patterned feature $620_2$ may be cross-lined to some degree, it is appreciated that the degree of cross-linking is not sufficient to render the photoresist material 622 insoluble in the developer.

Figure 6D:
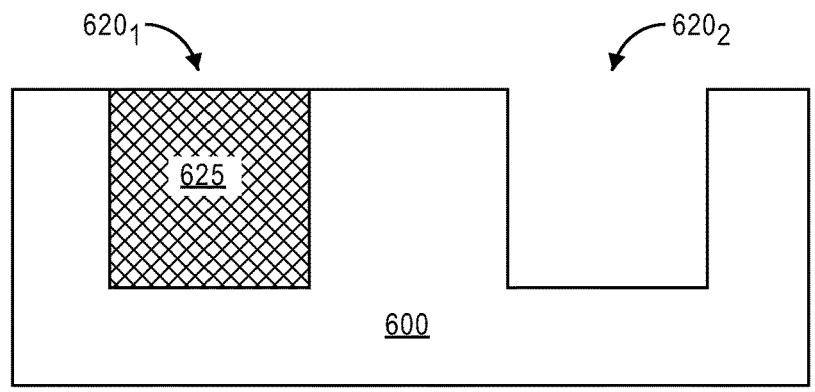
FIG. 6D illustrates a cross-sectional view of the interconnect structure in FIG. 6C after being developed, in accordance with an embodiment of the invention.

Referring now to FIG. 6D, the ILD 600 has been exposed to a developing solution. As illustrated, only the photoresist material 622 in the pre-patterned feature $620_2$ has been removed. Accordingly, the pre-patterned feature $620_1$ that is not desired to be patterned may include insoluble cross-linked photoresist material 625 that remained substantially insoluble to the developer due to the cross-linking reaction.

According to an embodiment of the invention, the photoresist material that remains after the developing process (in either a negative tone resist or a positive tone resist) may be modified further to augment the etch resistance for subsequent pattern transfer. By way of example, intercalation ('inclusion') techniques may be used to treat the photoresist materials after they have been patterned in order to improve their etch resistance. The ability to modify the etch-resistivity of the photoresist materials increases the flexibility in designing the pre-patterned features in the interconnect layer. For example, in some pre-patterned feature interconnect layer schemes etch resistance criteria is very stringent. By way of example, the intercalation techniques used to include additional molecules into the photoresist material may be liquid, vapor, or implant based. For example, the additional molecules added to the photoresist may include Si, Hf, and/or Zr.

According to an additional embodiment, in some pre-patterned feature interconnect layer schemes, it may be desirable to leave behind the patterned photoresist material, for example, as part of an interlayer dielectric, to avoid additional process operations otherwise required to remove the photoresist material and replace it with a material with the desired properties. By way of example, intercalation techniques, such as liquid, vapor, or implant based techniques, may provide the desired ILD properties to the patterned photoresist material. Such embodiments provide advantages for the integration of the patterning materials into the manufacturing process by reducing complexity and cost in the fabrication of the interconnect layer.

Figure 7:
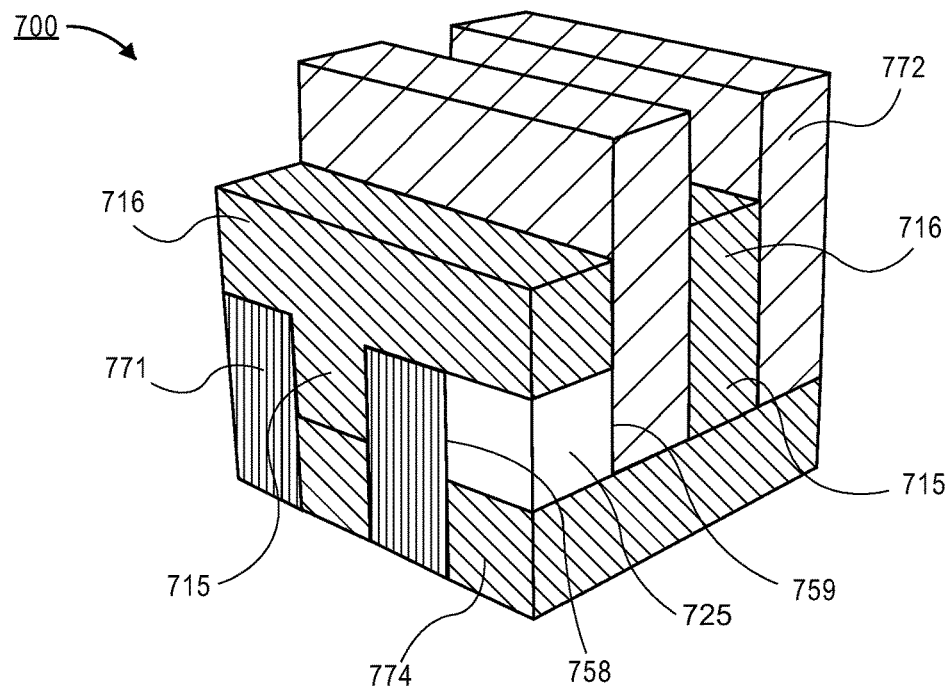
FIG. 7 illustrates a perspective view of the interconnect layer that includes a photoresist material that has been included in the interconnect layer as a dielectric material, in accordance with an embodiment of the invention.

For example, FIG. 7 illustrates a perspective view of a patterned photoresist material 725 that has be modified so that it includes properties similar to an ILD and is utilized in the interconnect layer 700 after formation of conductive vias 715 and interconnect lines 716. In an embodiment, the conductive layer 716 may extend over the top surface of the patterned photoresist material 725. According to an embodiment, the resulting structure may include up to four different dielectric material regions (i.e., the first material layer 771, the second material layer 772, the floor region 774, and the patterned photoresist material 725). According to such embodiments, in the completed interconnect layer 700, a first vertical seam 758 may be formed between the first material layer 771 and the patterned photoresist material 725, a second vertical seam 759 may be formed between the second material layer 772 and the patterned photoresist material 725, and a horizontal seam may be formed between the floor region 774 and the patterned photoresist material 725.

Figure 8:
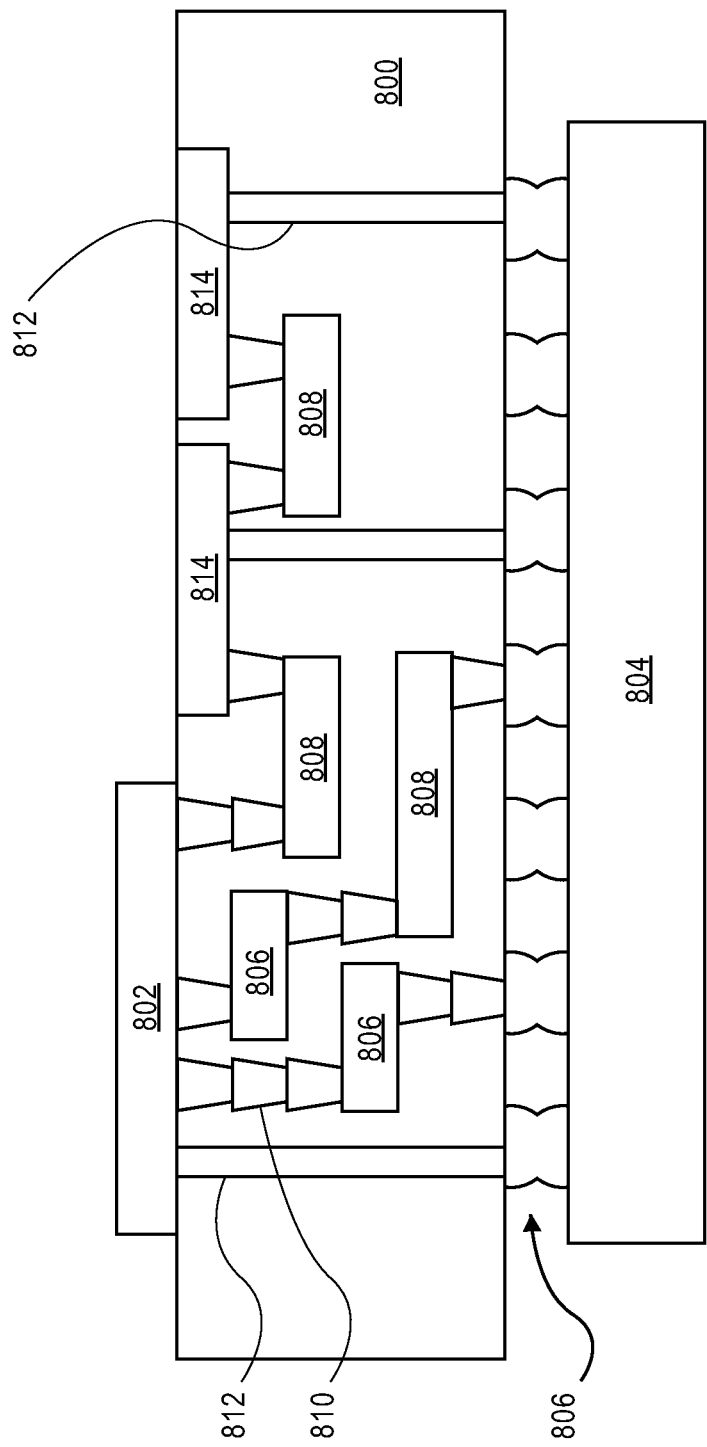
FIG. 8 is a cross-sectional illustration of an interposer implementing one or more embodiments of the invention.

FIG. 8 illustrates an interposer 800 that includes one or more embodiments of the invention. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800.

In accordance with embodiments of the invention, photoresist materials that undergo a solubility switch after a two-stage post exposure bake and methods of patterning such photoresist materials such as those described herein may be used in the fabrication of interposer 800.

Figure 9:
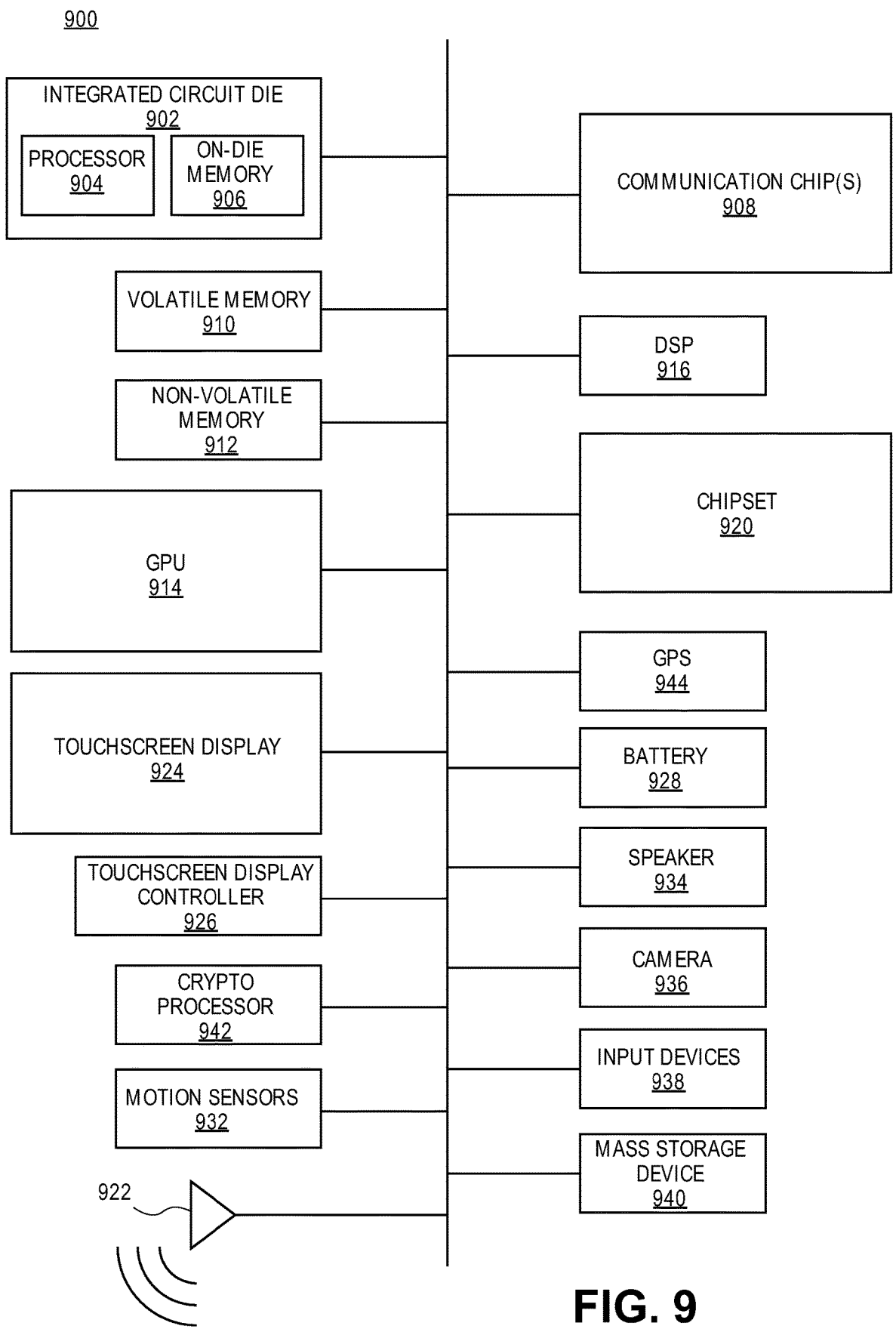
FIG. 9 is a schematic of a computing device built in accordance with an embodiment of the invention.

FIG. 9 illustrates a computing device 900 in accordance with one embodiment of the invention. The computing device 900 may include a number of components. In one embodiment, these components are attached to one or more motherboards. In an alternate embodiment, these components are fabricated onto a single system-on-a-chip (SoC) die rather than a motherboard. The components in the computing device 900 include, but are not limited to, an integrated circuit die 902 and at least one communication chip 908. In some implementations the communication chip 908 is fabricated as part of the integrated circuit die 902. The integrated circuit die 902 may include a CPU 904 as well as on-die memory 906, often used as cache memory, that can be provided by technologies such as embedded DRAM (eDRAM) or spin-transfer torque memory (STTM or STTM-RAM).

Computing device 900 may include other components that may or may not be physically and electrically coupled to the motherboard or fabricated within an SoC die. These other components include, but are not limited to, volatile memory 910 (e.g., DRAM), non-volatile memory 912 (e.g., ROM or flash memory), a graphics processing unit 914 (GPU), a digital signal processor 916, a crypto processor 942 (a specialized processor that executes cryptographic algorithms within hardware), a chipset 920, an antenna 922, a display or a touchscreen display 924, a touchscreen controller 926, a battery 928 or other power source, a power amplifier (not shown), a global positioning system (GPS) device 928, a compass 930, a motion coprocessor or sensors 932 (that may include an accelerometer, a gyroscope, and a compass), a speaker 934, a camera 936, user input devices 938 (such as a keyboard, mouse, stylus, and touchpad), and a mass storage device 940 (such as hard disk drive, compact disk (CD), digital versatile disk (DVD), and so forth).

The communications chip 908 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 908 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 908. For instance, a first communication chip 908 may be dedicated to shorter range wireless communications such as Wi-Fi and Bluetooth and a second communication chip 908 may be dedicated to longer range wireless communications such as GPS, EDGE, GPRS, CDMA, WiMAX, LTE, Ev-DO, and others.

The processor 904 of the computing device 900 includes one or more devices, such as transistors that are coupled to one or more interconnect lines that are formed in an interconnect structure that includes vias that are formed through pre-patterned features in an interconnect layer with photoresist materials that undergo a solubility switch after a two-stage post exposure bake such as those described herein, according to an embodiment of the invention. The term "processor" may refer to any device or portion of a device that processes electronic data from registers and/or memory to transform that electronic data into other electronic data that may be stored in registers and/or memory.

The communication chip 908 may also include one or more devices, such as transistors that are coupled to one or more interconnect lines that are formed in an interconnect structure that includes vias that are formed through pre-patterned features in an interconnect layer with photoresist materials that undergo a solubility switch after a two-stage post exposure bake such as those described herein, according to an embodiment of the invention.

In further embodiments, another component housed within the computing device 900 may contain one or more devices, such as transistors that are coupled to one or more interconnect lines that are formed in an interconnect structure that includes vias that are formed through pre-patterned features in an interconnect layer with photoresist materials that undergo a solubility switch after a two-stage post exposure bake such as those described herein, according to an embodiment of the invention.

In various embodiments, the computing device 900 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Embodiments of the invention include a photoresist material that comprises; a plurality of molecular glasses (MGs), wherein a ratio of MGs that include a blocking group is greater than 60%; and a plurality of photo-acid generators (PAGs), wherein a glass transition temperature $T_g$ of the photoresist material is less than an activation temperature needed to deblock blocking groups from the MGs with photo-acid produced by the PAGs.

Embodiments of the invention include a photoresist material, wherein the MGs are low molecular weight MGs.

Embodiments of the invention include a photoresist material, wherein the MGs are hydroxylated MGs.

Embodiments of the invention include a photoresist material, wherein the glass transition temperature $T_g$ is lower than approximately 70° C.

Embodiments of the invention include a photoresist material, wherein the glass transition temperature $T_g$ is less than approximately 50° C.

Embodiments of the invention include a photoresist material, wherein the blocking groups are tert-butyloxycarbonyl (t-BOC) blocking groups, acetal blocking groups, or environmentally stable chemically amplified photoresist (ES-CAP) blocking groups.

Embodiments of the invention include a photoresist material, wherein the activation temperature needed to deblock blocking groups from the MGs is greater than approximately 70° C.

Embodiments of the invention include a photoresist material, wherein the MGs are triphenol molecules or bisphenol A (BPA) molecules.

Embodiments of the invention include a photoresist material, that further comprises a plurality of cross-linking molecules, wherein the cross-linking molecules are activated by exposure to ultra violet radiation that has a different wavelength than the wavelength used to generate a photo-acid from the PAGs.

Embodiments of the invention include a photoresist material, wherein the cross-linking molecules are activated by exposure to ultra violet radiation that has a wavelength between approximately 330 nm and approximately 370 nm.

Embodiments of the invention include a photoresist material, wherein the cross-linking molecules are diazirine-based molecules.

Embodiments of the invention include a method of patterning a photoresist material, comprising; exposing the photoresist material with ultraviolet radiation, wherein the photoresist material comprises; a plurality of molecular glasses (MGs), wherein a ratio of MGs that include a blocking group is greater than 60%; and a plurality of photo-acid generators (PAGs), wherein a glass transition temperature $T_g$ of the photoresist material is less than an activation temperature needed to deblock blocking groups from the MGs, and wherein exposure to the ultraviolet radiation causes the PAGs to produce a plurality of photo-acid molecules; performing a first post exposure bake at a first temperature, wherein the first temperature is less than the activation temperature needed to deblock blocking groups from the MGs; performing a second post exposure bake at a second temperature that is approximately equal to or greater than the activation temperature needed to deblock blocking groups from the MGs; and developing the photoresist material with a developing solution.

Embodiments of the invention include a method of patterning a photoresist material, wherein the MGs are hydroxylated low molecular weight MGs.

Embodiments of the invention include a method of patterning a photoresist material, wherein the MGs are triphenol molecules or bisphenol A (BPA) molecules.

Embodiments of the invention include a method of patterning a photoresist material, wherein the glass transition temperature $T_g$ is lower than approximately 70° C.

Embodiments of the invention include a method of patterning a photoresist material, wherein the blocking groups are tert-butyloxycarbonyl (t-BOC) blocking groups, acetal blocking groups, or environmentally stable chemically amplified photoresist (ESCAP) blocking groups.

Embodiments of the invention include a method of patterning a photoresist material, wherein the activation temperature needed to provide sufficient activation energy to deblock blocking groups from the MGs is greater than approximately 70° C.

Embodiments of the invention include a method of patterning a photoresist material, wherein the photo-acid diffuses beyond an area exposed to the ultraviolet radiation during the first post exposure bake.

Embodiments of the invention include a method of patterning a photoresist material, comprising; exposing the photoresist material with ultraviolet radiation, wherein the photoresist material comprises: a plurality of molecular glasses (MGs), wherein a ratio of MGs that include a blocking group is greater than 60%; a plurality of photo-acid generators (PAGs), wherein exposure to the ultraviolet radiation causes the PAGs to produce a plurality of photo-acid molecules; and a plurality of cross-linking molecules that are activated by exposure to ultra violet radiation that has a second wavelength that is different than the wavelength used to generate the photo-acid molecules from the PAGs; performing a first post exposure bake at a first temperature, wherein the first temperature is sufficient to deblock blocking groups from the MGs, and allow for diffusion of the photo-acid molecules and the cross-linking molecules; performing a second post exposure bake, wherein the second post exposure bake includes exposing the photoresist material with ultraviolet radiation having the second wavelength that activates the cross-linking molecules and cross-links the photoresist material; and developing the photoresist material with a developing solution.

Embodiments of the invention include a method of patterning a photoresist material, wherein the cross-linking molecules are activated by exposure to ultra violet radiation that has a wavelength between approximately 330 nm and approximately 370 nm.

Embodiments of the invention include a method of patterning a photoresist material, wherein the cross-linking molecules are diazirine-based molecules.

Embodiments of the invention include a method of patterning a photoresist material, wherein activating the cross-linking molecules comprises forming a carbene intermediary.

Embodiments of the invention include a method of patterning a photoresist material, wherein the carbene intermediary reacts with an amine group formed on the deblocked MGs.

Embodiments of the invention include a photoresist material, that comprises; a plurality of hydroxylated low molecular weight molecular glasses (MGs), wherein a ratio of MGs that include a blocking group is between approximately 70% and 85%, wherein the blocking groups are tert-butyloxycarbonyl (t-BOC) blocking groups; and a plurality of photo-acid generators (PAGs), wherein a glass transition temperature $T_g$ of the photoresist material is less than an activation temperature needed to deblock blocking groups from the MGs, wherein the activation temperature is greater than approximately 70° C., and wherein the glass transition temperature of the photoresist material is less than approximately 50° C.

Embodiments of the invention include a photoresist material, wherein the MGs are triphenol molecules or bisphenol A (BPA) molecules.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:

1. A photoresist material, comprising:
   a plurality of molecular glasses (MGs);
   a plurality of photo-acid generators (PAGs); and
   a plurality of cross-linking molecules, wherein the cross-linking molecules are activated by exposure to ultra violet radiation that has a different wavelength than the wavelength used to generate a photo-acid from the PAGs.

2. The photoresist material of claim 1, wherein the MGs are low molecular weight MGs.

3. The photoresist material of claim 1, wherein the MGs are hydroxylated MGs.

4. The photoresist material of claim 1, wherein a glass transition temperature $T_g$ is lower than approximately 70° C.

5. The photoresist material of claim 4, wherein the glass transition temperature $T_g$ is lower than approximately 50° C.

6. The photoresist material of claim 1, wherein a ratio of MGs that include a blocking group is greater than 60%, and wherein the blocking groups are tert-butyloxycarbonyl (t-BOC) blocking groups, acetal blocking groups, or environmentally stable chemically amplified photoresist (ESCAP) blocking groups.

7. The photoresist material of claim 6, wherein an activation temperature needed to deblock blocking groups from the MGs is greater than approximately 70° C.

8. The photoresist material of claim 1, wherein the MGs are triphenol molecules or bisphenol A (BPA) molecules.

9. A photoresist material, comprising:
a plurality of molecular glasses (MGs), wherein a ratio of MGs that include a blocking group is greater than 60%;
a plurality of photo-acid generators (PAGs), wherein a glass transition temperature $T_g$ of the photoresist material is less than an activation temperature needed to deblock blocking groups from the MGs with photo-acid produced by the PAGs; and
a plurality of cross-linking molecules, wherein the cross-linking molecules are activated by exposure to ultra violet radiation that has a different wavelength than the wavelength used to generate a photo-acid from the PAGs.

10. The photoresist material of claim 9, wherein the cross-linking molecules are activated by exposure to ultra violet radiation that has a wavelength between approximately 330 nm and approximately 370 nm.

11. The photoresist material of claim 10, wherein the cross-linking molecules are diazirine-based molecules.

* * * * *